(12) United States Patent
DeCesaris et al.

(10) Patent No.: US 10,034,420 B2
(45) Date of Patent: Jul. 24, 2018

(54) DIMM EXTRACTION TOOL

(71) Applicant: Lenovo Enterprise Solutions (Singapore) Pte. Ltd., Singapore (SG)

(72) Inventors: Michael DeCesaris, Carrboro, NC (US); Luke D. Remis, Raleigh, NC (US); Steven L. Vanderlinden, Hillsborough, NC (US); John K. Whetzel, Holly Springs, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 1191 days.

(21) Appl. No.: 13/719,499

(22) Filed: Dec. 19, 2012

(65) Prior Publication Data
US 2014/0170881 A1  Jun. 19, 2014

(51) Int. Cl.
*B23P 19/00* (2006.01)
*H05K 13/04* (2006.01)
*H01R 43/22* (2006.01)
*H01R 13/627* (2006.01)

(52) U.S. Cl.
CPC ..... *H05K 13/0491* (2013.01); *H01R 13/6273* (2013.01); *H01R 43/22* (2013.01); *Y10T 29/53283* (2015.01)

(58) Field of Classification Search
CPC ......... Y10T 29/53283; Y10T 29/53274; Y10T 29/53; Y10T 29/53222; Y10T 29/5313; Y10T 29/53174; H01R 43/22; H01R 43/26; H01R 13/6273; H01R 13/6271; H01R 13/6276; H01R 13/6277; H01R 13/6278; H05K 13/0491; H05K 13/0486

USPC ................. 29/764, 762, 700, 758, 729, 739; 439/327, 157, 160, 159, 188, 328, 358, 439/155
See application file for complete search history.

(56) References Cited

U.S. PATENT DOCUMENTS

| | | | |
|---|---|---|---|
| 4,858,309 A | 8/1989 | Korsunsky et al. | |
| 5,046,237 A | 9/1991 | Conforti et al. | |
| 5,265,328 A | 11/1993 | Gorman | |
| 5,479,669 A * | 1/1996 | Chen .................. | H05K 13/0092 29/758 |
| 6,018,867 A | 2/2000 | Boe | |
| 7,255,577 B2 | 8/2007 | Graham et al. | |
| 7,379,297 B2 * | 5/2008 | Peterson ................. | G06F 1/206 361/690 |
| 7,396,244 B1 | 7/2008 | Barna et al. | |
| 7,913,379 B2 | 3/2011 | Bodenweber et al. | |

(Continued)

*Primary Examiner* — Peter DungBa Vo
*Assistant Examiner* — Azm Parvez
(74) *Attorney, Agent, or Firm* — Jeffrey L. Streets

(57) ABSTRACT

Aspects of the present invention disclose a DIMM extraction tool for extracting a DIMM from a DIMM socket. Exemplary embodiments of the DIMM extraction tool include a frame adapted for use as an air baffle within the DIMM socket, a first arm and a second arm pivotably connected to the frame. When the first arm and second arm are in a resting position, the first and second arm respectively engage a first resting detent and a second resting detent to prevent pivotable rotation of the first arm and second arm in exemplary embodiments of the DIMM extraction tool. When the first arm and second arm are in a working position, the first arm and second arm respectively are adapted to releasably engage the DIMM and bias resilient latching arm of the DIMM socket.

16 Claims, 2 Drawing Sheets

(56) References Cited

U.S. PATENT DOCUMENTS

| | | | |
|---|---|---|---|
| 7,987,584 B2* | 8/2011 | Barna | H05K 7/1415 29/259 |
| 2006/0185159 A1 | 8/2006 | Correll et al. | |
| 2007/0032114 A1 | 2/2007 | Sanders et al. | |

* cited by examiner

DIMM EXTRACTION TOOL

FIELD OF THE INVENTION

The present invention relates generally to dual inline memory modules (DIMMs) and more specifically to an extraction tool for removing dual inline memory modules from a DIMM socket.

BACKGROUND

Present-day server designs contain a large number of DIMMs. Upwards of 96 DIMMs in a system is not uncommon. DIMM sockets are designed with two retaining latches. Typically, users operate these two retaining latches using their fingers. These latches can become quite painful if multiple DIMMs must be added or replaced.

In parallel, blade and integrated test environment (ITE) servers in particular are very sensitive to the amount of air flowing through them. The blade and ITE servers are designed with a specific air impedance. Too much flow in the servers will degrade the cooling of other parts of the system. Typically, these servers are shipped with air baffles inserted in DIMM sockets that do not have populated DIMMs.

SUMMARY

Aspects of the present invention disclose a DIMM extraction tool for extracting a DIMM from a DIMM socket. Exemplary embodiments of the DIMM extraction tool include a frame adapted for use as an air baffle within the DIMM socket, a first arm and a second arm pivotably connected to the frame. When the first arm and second arm are in a resting position, the first and second arm respectively engage a first resting detent and a second resting detent to prevent pivotable rotation of the first arm and second arm in exemplary embodiments of the DIMM extraction tool. When the first arm and second arm are in a working position, the first arm and second arm respectively are adapted to releasably engage the DIMM and bias resilient latching arm of the DIMM socket.

DETAILED DESCRIPTION

The present invention will now be described in detail with reference to the figures.

Figure 1:
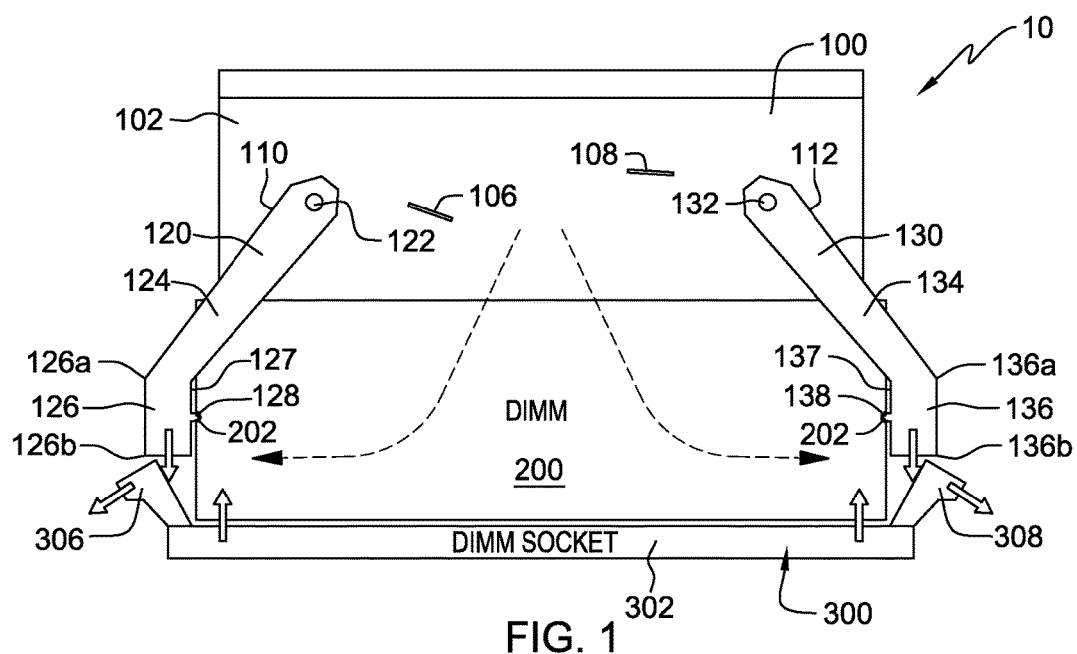
FIG. 1 depicts a perspective view of an example of a DIMM extraction tool in a working position engaging a DIMM within a DIMM socket according to the present invention.
Figure 2:
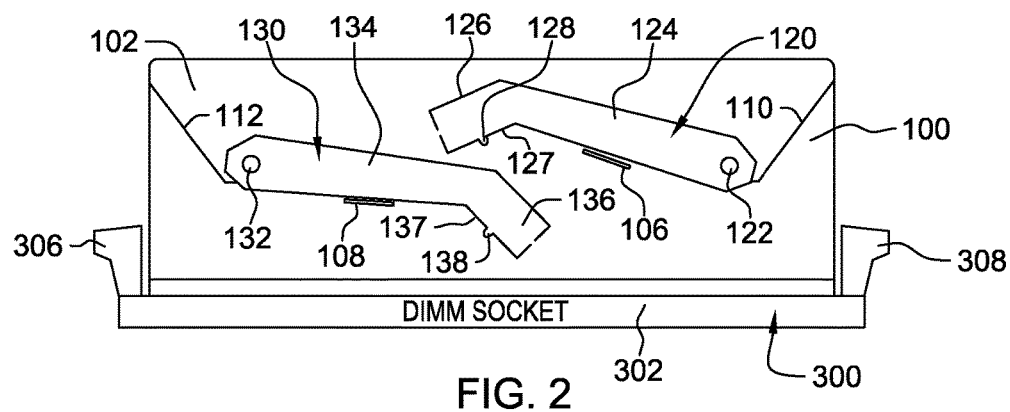
FIG. 2 depicts a front elevated view of an example of a DIMM extraction tool in a resting position according to the present invention.
Figure 3:
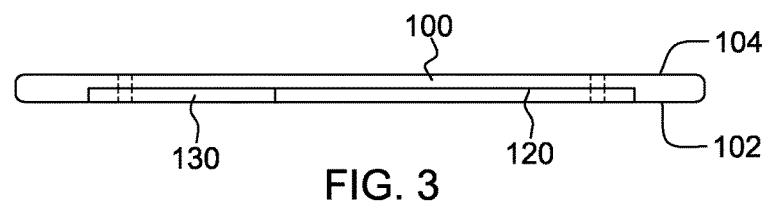
FIG. 3 depicts a top plan view of an example of a DIMM extraction tool in a resting position according to the present invention.

FIGS. 1-3 illustrates a DIMM extraction tool generally designated 10 for extracting a DIMM from a DIMM socket according to one embodiment of the present invention. FIGS. 1-3+ provide only an illustration of one implementation and do not imply any limitations with regard to the environments in which different embodiments may be implemented. Many modifications to the depicted environments may be made.

Generally, DIMM extraction tool 10 may provide for easier mechanism to unlatch and remove DIMMs. Exemplary embodiments of extraction tool 10 may provide for adequate air flow within the server along with providing a mechanism for extracting DIMMs from DIMM sockets of a blade and rack design.

Exemplary embodiments of DIMM extraction tool 10 is adapted to extract DIMMs and/or similar electrical components from various DIMM sockets and/or similar electrical receptacles. One such exemplary DIMM socket 300 is depicted in FIG. 1. DIMM socket 300 includes terminals which extend therethrough to electrically connect conductive areas of DIMM 200 with corresponding conductive areas of DIMM socket 300. The configuration of the terminals allows DIMM socket 300 to be used in high density applications.

In order to adequate electrical connection between DIMM 200 and DIMM socket 300, channel 302 and resilient latching arms 306 and 308 are provided on DIMM socket 300. Channel 302 and resilient latching arms 306 and 308 cooperate with fully seated DIMM 200 to maintain DIMM 200 in a fully seated position. This type of cooperation maintains that DIMM 200 will be maintained in adequate electrical engagement with DIMM socket 300.

Although channel 302 and resilient latching arms 306 and 308 insure that an adequate electrical connection is maintained between DIMM 200 and DIMM socket 300, channel 302 and resilient latching arms 306 and 308 create a problem when DIMM 200 is to be removed from DIMM socket 300. As DIMM socket 300 and DIMM are normally maintained in a dense environment, it may become extremely difficult to remove, to replace, or to repair DIMMs 200 from DIMM sockets 300, without causing harm to DIMMs 200 and/or DIMM sockets 300.

An exemplary embodiment of DIMM extraction tool 10 includes a frame 100, and a first arm 120 and a second arm 130 pivotably connected thereto, 122 and 132. In exemplary embodiments, frame 100 is substantially cuboid in geometry, with a front face 102 and a back face 104. In this exemplary embodiment, first arm 120 and second arm 130 are pivotably connected to front face 102 of frame 100. Typically, exemplary embodiments of frame 100 are configured to be an air baffle for use within a DIMM socket 300 during normal operation. As such, front face 102, back face 104 and sides of frame may include protrusions and/or recesses that facilitate air flow in a predetermined manner.

Exemplary embodiments of frame 100 include detents 106, 108, 110, and 112. Detents 106 and 108 respectively prevent pivotable rotation of first arm 120 and second arm 130 by engaging at least a portion of first arm 120 and second arm 130 when first arm 120 and second arm 130 are in a resting position. Detents 110 and 112 respectively prevent pivotable rotation of first arm 120 and second arm 130 by engaging at least a portion of first arm 120 and second arm 130 when first arm 120 and second arm 130 are in a working position.

Figure 4:
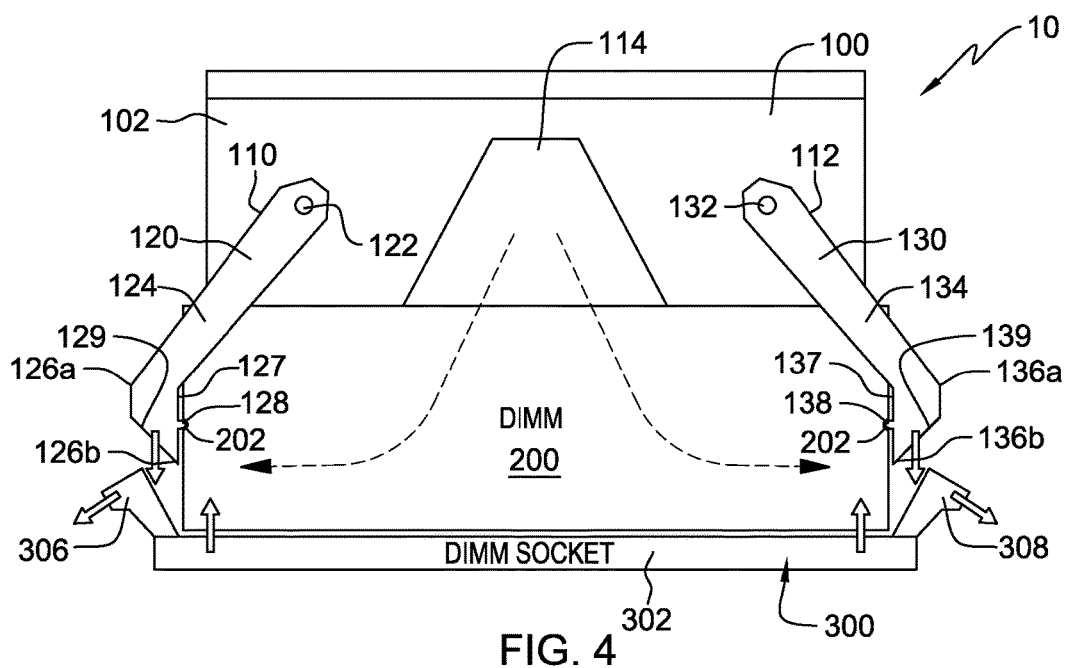
FIG. 4 depicts a perspective view of an example of a DIMM extraction tool in a working position engaging a DIMM within a DIMM socket according to the present invention.
Figure 5:
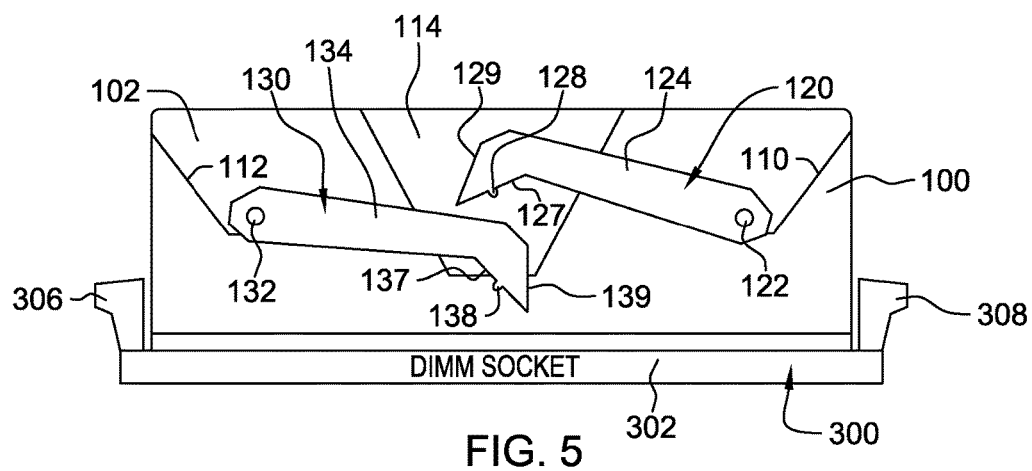
FIG. 5 depicts a front elevated view of an example of a DIMM extraction tool in a resting position according to the present invention.
Figure 6:
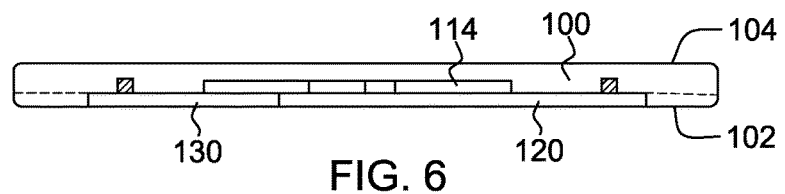
FIG. 6 depicts a top plan view of an example of a DIMM extraction tool in a resting position according to the present invention.

In another exemplary embodiment, frame 100 includes a recessed portion 114, as depicted in FIGS. 4-6, which functions in a manner similar to detents 106 and 108. The recessed portion 114 is fabricated in such a manner to prevent the pivotable rotation of first arm 120 and second arm 130 in both the resting and working positions of such arms by engaging at least a portion of first arm 120 and second arm 130 respectively.

In exemplary embodiments, first arm 120 and second arm 130 are pivotably connected 122 and 132 to front face 102 of frame 100. First arm 120 and second arm 130 include respective main portions 124 and 134, along with engaging portions 126 and 136. In one exemplary embodiment, main portions 124 and 134 are substantially-thin bars that are pivotably attached 122 and 132 to frame 100, each at a respective proximal end 122a, 132a thereof. Typically, but not necessarily, the thickness of main portions 124 and 134 correspond with the thickness of DIMM 200. Additionally, main portions 124 and 134 respectively attach with respective engaging portions 126 and 136. In exemplary embodiments, main portions 124 and 134 are integral with engaging portions 126 and 136.

In one exemplary embodiment, engaging portions 126 and 136 are substantially-thin bars. Typically, but not necessarily, the thickness of engaging portions 126 and 136 correspond with the thickness that is less than DIMM 200 so that when first and second arms 120 and 130 are in the working position, frame 100 engages the top side DIMM 200. In exemplary embodiments, engaging portions 126 and 136 extend outwardly from respective main portions 124 and 134 so that first sidewalls 127 and 137 engage to the corresponding sidewalls of DIMM 200 when the first arm 120 and second arm 130 are in working positions, as depicted in FIG. 1. In exemplary embodiments, first sidewalls 127 and 137 include protruding members 128 and 138 that correspond to apertures 202 in sidewalls of DIMM 200 to facilitate the releasable engagement of DIMM extraction tool 10 with DIMM 200. Although only one protruding member is shown in this embodiment, other embodiments may have any number of protruding members of various sizes and geometries to correspond with different DIMMs. Additionally, first sidewalls 127 and 137 may include apertures (not shown) to facilitate releasable engagement of DIMMs that include protruding members (not shown).

As will be more fully described, engaging portions 126 and 136 are dimensioned to frictionally engage DIMM 200. In order to enhance the frictional engagement between engaging portions 126 and 136 and DIMM 200 various holding devices may be placed along first sidewalls 127 and 137. Holding devices may include, but are not limited to, embossments, chinese fingers, etc.

Exemplary embodiments of engaging portions 126 and 136 taper 129 and 139 from respective first ends 126a and 136a to respective second ends 126b and 136b, as depicted in FIGS. 4 and 5. The taper of engaging portions 126 and 136 may facilitate the biasing of resilient latching arms 306 and 308 during the extraction of DIMM 200 from DIMM socket 300. Although exemplary embodiments include a taper from respective first ends 126a and 136a to respective second ends 126b and 136b, in other exemplary embodiments other geometries of engaging portion 126 and 136 may be used to facilitate the biasing of resilient latching arms 306 and 308 during the extraction of DIMM 200 from DIMM socket 300.

During operation, DIMM extraction tool 10 is moved from a resting position, as depicted in FIGS. 2 and 5, to a working position, as depicted in FIGS. 1 and 4. In the resting position, first and second arms 120 and 130 are pivotably situated so that at least a portion of first and second arms 120 and 130 respectively engage a portion of frame 100 to prevent movement of first and second arms 120 and 130 relative to frame 100 when DIMM extraction tool is being utilized as an air baffle situated within a DIMM socket.

Typically, DIMM extraction tool 10 is positioned around DIMM 200 so that first sidewalls 127 and 137 engage to the corresponding sidewalls of DIMM 200 engaging portions 126 and 136. As positioning of DIMM extraction tool 10 around DIMM 200 continues, engaging portions 126 and 136 engage resilient latching arms 306 and 308, causing resilient latching arms 306 and 308 to bias away from DIMM 200, as depicted in FIGS. 1 and 4, thereby allowing DIMM 200 to be removed from DIMM socket 300.

In some exemplary embodiments where the corresponding sidewalls of DIMM 200 include apertures 202, protruding members 128 and 138 that correspond to apertures 202 facilitate the releasable engagement of DIMM extraction tool 10 with DIMM 200.

Exemplary embodiments of first and second arms 120 and 130 are of a geometry and length that when DIMM extraction tool 10 is in the working position with first and second arms 120 and 130 extending away from frame 100, at least a portion of frame 100 engages DIMM 200 to impede positioning of DIMM extraction tool 10, as seen in FIGS. 1 and 4. The impedance of DIMM extraction tool 10 by frame 100 engaging DIMM 200 reduces the likelihood of resilient latching arms 306 and 308 breaking due to fatigue or biasing to a point of failure, as can happen during manual operation of resilient latching arms 306 and 308 without the use of DIMM extraction tool 10.

DIMM extraction tool 10 can be made from any material having the strength characteristics required. The use of DIMM extraction tool 10 insures that DIMMs 200 can be removed from DIMM sockets 300 with a significant decrease in likelihood that DIMM socket 300 or DIMM 200 is damaged. Furthermore, DIMM extraction tool 10 is a modified air baffle that is adapted to engage within a DIMM socket to provide little to no extra manufacturing cost, as many times air baffles are inserted in DIMM sockets on servers that are shipped that do not have DIMM sockets populated with DIMMs.

Based on the foregoing, exemplary embodiments of a road traction apparatus have been disclosed. However, numerous modifications and substitutions can be made without deviating from the scope of the present invention. Therefore, the present invention has been disclosed by way of example and not limitation.

What is claimed is:

1. A DIMM extraction tool for extracting a DIMM from a DIMM socket, comprising:
   a frame adapted for use as an air baffle within the DIMM socket;
   a first arm and a second arm pivotably connected to the frame;
   wherein when the frame, the first arm and the second arm are in a resting position, the first arm and the second arm respectively engage a first portion of the frame to prevent pivotable rotation of the first arm and second arm;
   wherein when the frame, the first arm and the second arm are in a working position, the first arm and the second arm respectively are adapted to releasably engage the DIMM and bias resilient latching arms of the DIMM socket; and
   wherein the resting position of the frame is a vertically inverted orientation relative to the working position of the frame.

2. The tool of claim 1, wherein when the frame, the first arm and the second arm are in the resting position, the first arm and the second arm respectively engage a first resting detent and a second resting detent to prevent pivotable rotation of the first arm and the second arm.

3. The tool of claim 1, wherein when the frame, the first arm and the second arm are in the resting position, the first arm and the second arm respectively engage a recessed portion of the frame to prevent pivotable rotation of the first arm and the second arm.

4. The tool of claim 1, wherein when the frame, the first arm and the second arm are in the working position, the first arm and the second arm respectively engage a second portion of the frame to prevent pivotable rotation of the first arm and second arm.

5. The tool of claim 4, wherein when the the frame, first arm and the second arm are in the working position, the first arm and the second arm respectively engage a first working detent and a second working detent to prevent pivotable rotation of the first arm and the second arm.

6. The tool of claim 1, wherein the first arm and the second arm include respective protruding members that correspond to apertures in a sidewall of the DIMM.

7. The tool of claim 1, wherein the first arm and the second arm include a taper in respective engaging portions of the first arm and the second arm to facilitate the biasing of the resilient latching arms of the DIMM socket.

8. A DIMM extraction tool for extracting a DIMM from a DIMM socket, comprising:
a frame adapted for use as an air baffle within the DIMM socket;
a first arm and a second arm pivotably connected to the frame;
wherein when the frame, the first arm and the second arm are in a resting position, the first arm and the second arm respectively engage a first portion of the frame to prevent pivotable rotation of the first arm and second arm;
wherein when the frame, the first arm and the second arm are in a working position, the first arm and the second arm respectively are adapted to releasably engage the DIMM and bias resilient latching arms of the DIMM socket;
wherein when the frame, the first arm and the second arm are in the working position, the first arm and the second arm respectively engage a second portion of the frame to prevent pivotable rotation of the first arm and second arm; and
wherein the resting position of the frame is a vertically inverted orientation relative to the working position of the frame.

9. The tool of claim 8, wherein when the frame, the first arm and the second arm are in the resting position, the first arm and the second arm respectively engage a first resting detent and a second resting detent to prevent pivotable rotation of the first arm and the second arm.

10. The tool of claim 8, wherein when the frame, the first arm and the second arm are in the resting position, the first arm and the second arm respectively engage a recessed portion of the frame to prevent pivotable rotation of the first arm and the second arm.

11. The tool of claim 8, wherein when the frame, the first arm and the second arm are in the working position, the first arm and the second arm respectively engage a first working detent and a second working detent to prevent pivotable rotation of the first arm and the second arm.

12. The tool of claim 8, wherein the first arm and the second arm include respective protruding members that correspond to apertures in a sidewall of the DIMM.

13. The tool of claim 8, wherein the first arm and the second arm include a taper in respective engaging portions of the first arm and the second arm to facilitate the biasing of the resilient latching arms of the DIMM socket.

14. A DIMM extraction tool for extracting a DIMM from a DIMM socket, comprising:
a frame adapted for use as an air baffle within the DIMM socket;
a first arm and a second arm pivotably connected to the frame;
wherein when the frame, the first arm and the second arm are in a resting position, the first arm and the second arm respectively engage a first resting detent and a second resting detent to prevent pivotable rotation of the first arm and second arm;
wherein when the frame, the first arm and the second arm are in a working position, the first arm and the second arm respectively are adapted to releasably engage the DIMM and bias resilient latching arms of the DIMM socket;
wherein when the frame, the first arm and the second arm are in the working position, the first arm and the second arm respectively engage a first working detent and a second working detent to prevent pivotable rotation of the first arm and second arm; and
wherein the resting position of the frame is a vertically inverted orientation relative to the working position of the frame.

15. The tool of claim 14, wherein the first arm and the second arm include respective protruding members that correspond to apertures in a sidewall of the DIMM.

16. The tool of claim 14, wherein the first arm and the second arm include a taper in respective engaging portions of the first arm and the second arm to facilitate the biasing of the resilient latching arms of the DIMM socket.

* * * * *